(12) United States Patent
Chen et al.

(10) Patent No.: US 11,658,046 B2
(45) Date of Patent: May 23, 2023

(54) SEMICONDUCTOR PACKAGING STRUCTURE WITH BACK-DEPOSITED SHIELDING LAYER AND MANUFACTURING METHOD THEREOF

(71) Applicant: Powertech Technology Inc., Hukou Township, Hsinchu County (TW)

(72) Inventors: Shih-Chun Chen, Hsinchu (TW); Sheng-Tou Tseng, Hsinchu (TW); Kun-Chi Hsu, Hsinchu (TW); Chin-Ta Wu, Hsinchu (TW); Ting-Yeh Wu, Hsinchu (TW)

(73) Assignee: Powertech Technology Inc., Hukou Township (TW)

( * ) Notice: Subject to any disclaimer, the term of this patent is extended or adjusted under 35 U.S.C. 154(b) by 95 days.

(21) Appl. No.: 17/094,537

(22) Filed: Nov. 10, 2020

(65) Prior Publication Data

US 2021/0217632 A1    Jul. 15, 2021

Related U.S. Application Data

(60) Provisional application No. 62/960,718, filed on Jan. 14, 2020.

(30) Foreign Application Priority Data

Jun. 30, 2020  (TW) ................................. 109122151

(51) Int. Cl.
*H01L 23/552* (2006.01)
*H01L 21/56* (2006.01)

(52) U.S. Cl.
CPC .......... *H01L 21/561* (2013.01); *H01L 21/568* (2013.01); *H01L 23/552* (2013.01)

(58) Field of Classification Search
None
See application file for complete search history.

(56) References Cited

U.S. PATENT DOCUMENTS 6,722,030 B1 *   4/2004  Stelzl ................... H01L 23/552
                                                          29/841
2010/0270668 A1 * 10/2010 Marcoux ............. H01L 25/0657
                                                          257/E21.546

(Continued)

*Primary Examiner* — Jay C Chang
(74) *Attorney, Agent, or Firm* — PatentTM.US

(57) ABSTRACT

Batch semiconductor packaging structures with back-deposited shielding layer and manufacturing method are provided. A grid having multiple frames is glued on an adhesive substrate. Multiple semiconductor devices respectively align with corresponding frames and are stuck on the adhesive substrate. Then a metal layer covers the semiconductor devices and the grid. A distance between four peripheries of a bottom of each semiconductor device and the corresponding frame is smaller than a distance between the bottom and the adhesive substrate, so that the a portion of the metal layer extended to the peripheries of the bottom is effectively reduced during forming the metal layer. After the semiconductor devices are picked up, no metal scrap is remined thereon. Therefore, the adhesive substrate does not need to form openings in advance and is reusable. The grid is also reusable so the manufacturing cost of the present invention is decreased.

7 Claims, 7 Drawing Sheets

(56) References Cited

U.S. PATENT DOCUMENTS

| | | | |
|---|---|---|---|
| 2014/0036466 A1* | 2/2014 | Pahl | ........................ H01L 23/10 |
| | | | 156/150 |
| 2019/0189659 A1* | 6/2019 | Matsuzawa | ....... H01L 27/14683 |
| 2020/0066954 A1* | 2/2020 | Kuo | ........................ H01L 33/44 |
| 2020/0135497 A1* | 4/2020 | Wu | ........................ H01L 21/563 |

* cited by examiner

SEMICONDUCTOR PACKAGING STRUCTURE WITH BACK-DEPOSITED SHIELDING LAYER AND MANUFACTURING METHOD THEREOF

CROSS-REFERENCE TO RELATED APPLICATIONS

This application claims the benefit of United States provisional application filed on Jan. 14, 2020 and having application Ser. No. 62/960,718, the entire contents of which are hereby incorporated herein by reference.

This application is based upon and claims priority under 35 U.S.C. 119 from Taiwan Patent Application No. 109122151 filed on Jun. 30, 2020, which is hereby specifically incorporated herein by this reference thereto.

BACKGROUND OF THE INVENTION

1. Field of the Invention

The present invention is related to a semiconductor packaging structures and a manufacturing method thereof, especially to a semiconductor packaging structure with back-deposited shielding layer and a manufacturing method thereof.

2. Description of the Prior Arts

A semiconductor packaging structure having electromagnetic interference shielding and heat dissipation requirements usually have an outer metal layer attached to the encapsulation of the semiconductor packaging structure.

With reference to FIGS. 6A to 6E, a conventional manufacturing method to form the outer metal layer on the semiconductor packaging structure comprises following steps. As shown in FIGS. 6A and 6B, a tape 40 is cut to form multiple openings 41. A size of each opening 41 is smaller than that of each semiconductor device 50. As shown in 6C, the bottoms of the semiconductor devices 50 respectively align with the openings 41. Thus, the solder balls 51 on the bottoms of the semiconductor device 50 respectively protrude through the openings 41, while the peripheries of the bottoms of the semiconductor device 50 are stuck on the tape 40 surrounding the opening 41. Then, as shown in FIG. 6D, the metal layer 52 is formed on the semiconductor devices 50 and the tape 40 by a metal deposition process to constitute the semiconductor packaging structure 50' with the outer metal layer as shown in FIG. 6E.

With reference to FIG. 6E, the semiconductor packaging structure 50' is picked up from the tape 40. However, the metal layer 52 is stuck on the tape 40, and is also formed on the semiconductor packaging structure 50'. When the semiconductor packaging structure 50' is picked up, the peripheries of the metal layer 52 having some metal scraps 521, which need to be removed by extra processes. Further, the tape 40 is cut to form openings 41 in the conventional manufacturing method, so that the tape 40 cannot to be reused. Therefore, the manufacturing cost of the conventional manufacturing method is higher.

With reference to FIG. 7, another conventional manufacturing method to form the outer metal layer on the semiconductor packaging structure 50' is similar to the foregoing one, but the tape 40 need not to form openings. The semiconductor devices 50 are stuck on the tapes directly and then the metal deposition process. However, since the solder balls 52 on the bottoms of the semiconductor devices 50 have a certain height, a gap is formed between the bottoms of the semiconductor devices 50 and the tape 40. When the metal is deposited, the metal is over-plated on the edges of the bottoms of the semiconductor devices 50, i.e. that the over-plating metal layer 522 extend to the edges of the bottoms of the semiconductor devices 50. When the gap is too large, the area of over-plating metal layer 522 is large enough to connect to some of the solder balls 51 on the bottoms. Therefore, although the another conventional manufacturing method reduces the cost to forming openings on the tape, the yield rate of the semiconductor packaging structure 50' is also reduced.

SUMMARY OF THE INVENTION

To overcome the shortcomings of, the present invention provides a new semiconductor packaging structure with a back-deposited shielding layer and a manufacturing method thereof.

To achieve the objective as mentioned above, the present invention provides a semiconductor packaging structure with a back-deposited shielding layer comprising:
  a substrate having an adhesive layer;
  a grid adhered to the adhesive layer of the substrate and having multiple frames;
  multiple semiconductor devices, and each semiconductor device corresponding to one of the frames and having
    a body having a first surface, a second surface, a third surface, a fourth surface, a fifth surface and a sixth surface, wherein
      the first surface face to the adhesive layer of the substrate and is distant from the adhesive layer at a first distance;
      a second distance is disposed between a periphery of the first surface and the corresponding frame; and
      the second distance is smaller than the first distance; and
    multiple solder balls disposed on the first surface, aligning with an opening of the corresponding frame and adhered to a portion of the adhesive layer in the opening; and
  a metal layer forming on the grid and the second to sixth surfaces of the bodies of the semiconductor devices.

With the foregoing description, the present invention mainly adheres the grid to the adhesive layer of the substrate so that the distance between the adhesive layer and a periphery of the first surface with the solder balls thereon of each semiconductor device is effectively reduced, which is even reduced to zero. Then the range of the metal layer extending to the periphery of the first surface is effectively reduced to ensure that the metal layer is not connected to the solder balls on the first surface. Thus, the substrate of the present invention does not need to have openings in advance, so that the adhesive substrate and the grid are reusable to decrease the manufacturing cost of the back-deposited shielding layer.

In another aspect, the prevention also provides a manufacturing method of massively packaging semiconductor devices into a semiconductor packaging structure with a back-deposited shielding layer comprising steps of:
  (a) providing an adhesive substrate;
  (b) adhering a grid to the adhesive substrate, wherein the grid comprises multiple frames;
  (c) aligning multiple semiconductor devices respectively with the frames by facing a first surface with solder balls thereon of each semiconductor device to the adhesive substrate, and adhering the solder balls on the adhesive substrate, wherein the first surface of each semiconductor device is distant from the adhesive substrate at a first distance, a second distance is disposed between a corresponding frame and a periphery of the first surface of each semiconductor device, and the second distance is smaller than the first distance;

(d) forming a metal layer on the grid and a second surface, a third surface, a fourth surface, a fifth surface and a sixth surface of each semiconductor device; and (e) picking up the semiconductor devices from the adhesive substrate.

With the foregoing description, the present invention mainly adheres the grid to the adhesive layer of the substrate so that the distance between the adhesive substrate and a periphery of the first surface with the solder balls thereon of each semiconductor device is effectively reduced to even zero. In the step of forming the metal layer, the range of the metal layer extending to the periphery of the first surface is effectively reduced to that the metal layer is not connected to the solder balls on the first surface. Thus, the substrate of the present invention does not need to have openings in advance, so that the adhesive substrate and the grid are reusable to decrease the manufacturing cost of the back-deposited shielding layer.

Other objectives, advantages and novel features of the invention will become more apparent from the following detailed description when taken in conjunction with the accompanying drawings.

DETAILED DESCRIPTION OF THE PREFERRED EMBODIMENTS

With an embodiment and drawings thereof, the features of the present invention are described in detail as follow.

Figure 1A:
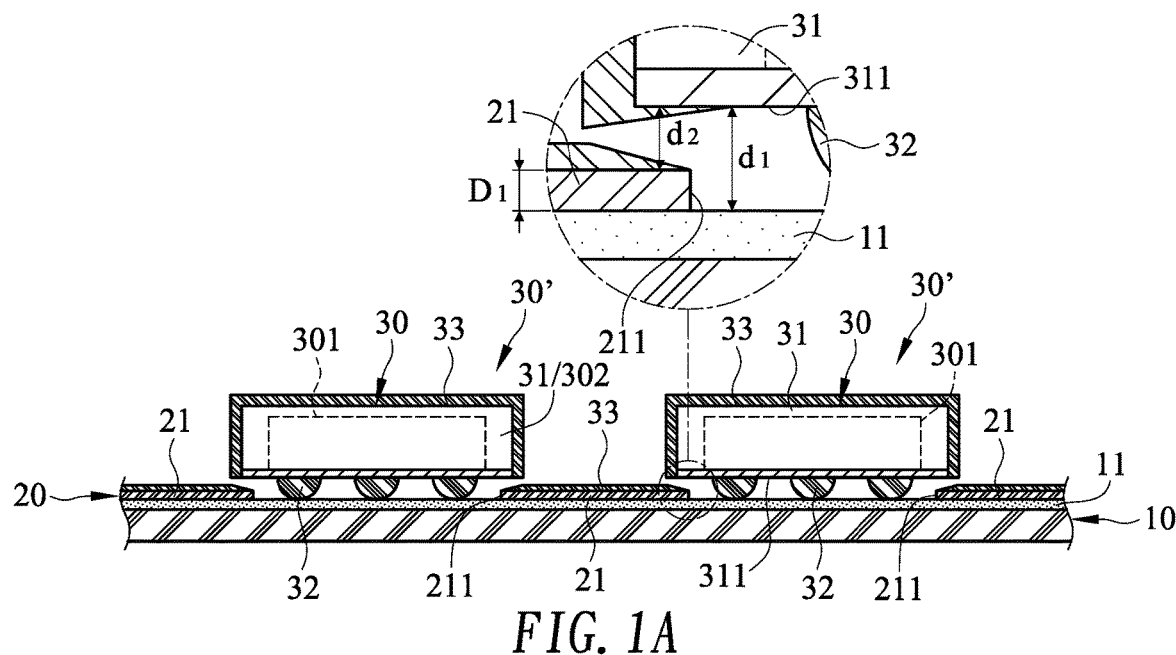
FIG. 1A is a side view in partial section of a first embodiment of a semiconductor packaging structure with a back-deposited shielding layer in accordance with the present invention.

With reference to FIG. 1A, a first embodiment of a semiconductor packaging structure with a back-deposited shielding layer in accordance with the present invention comprises a substrate 10, a grid frame 20, multiple semiconductor devices 30 and a metal layer 33.

Figure 2:
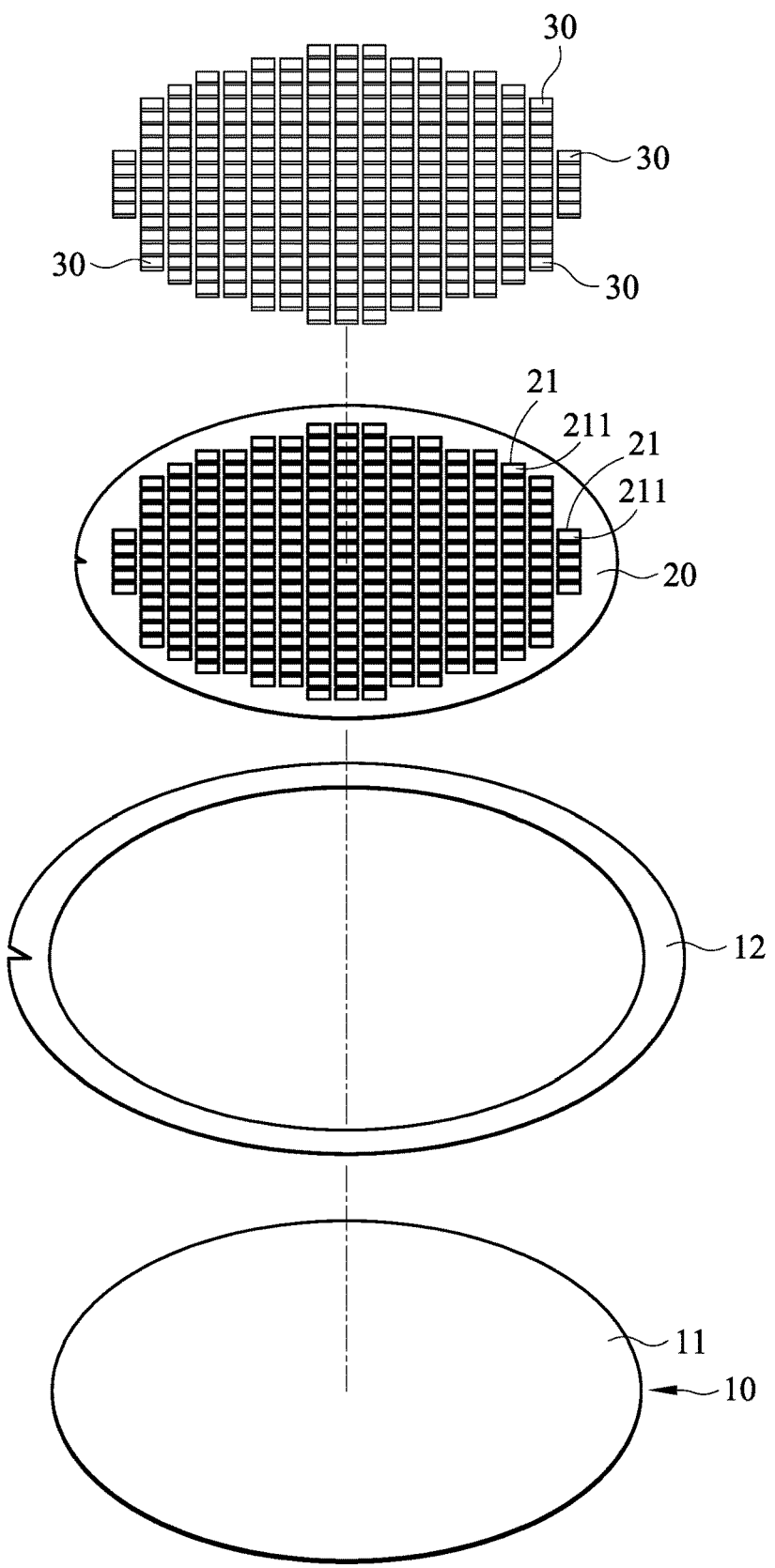
FIG. 2 is an exploded perspective view of the structure in one of the steps of a manufacturing method in accordance with the present invention.
Figure 3:
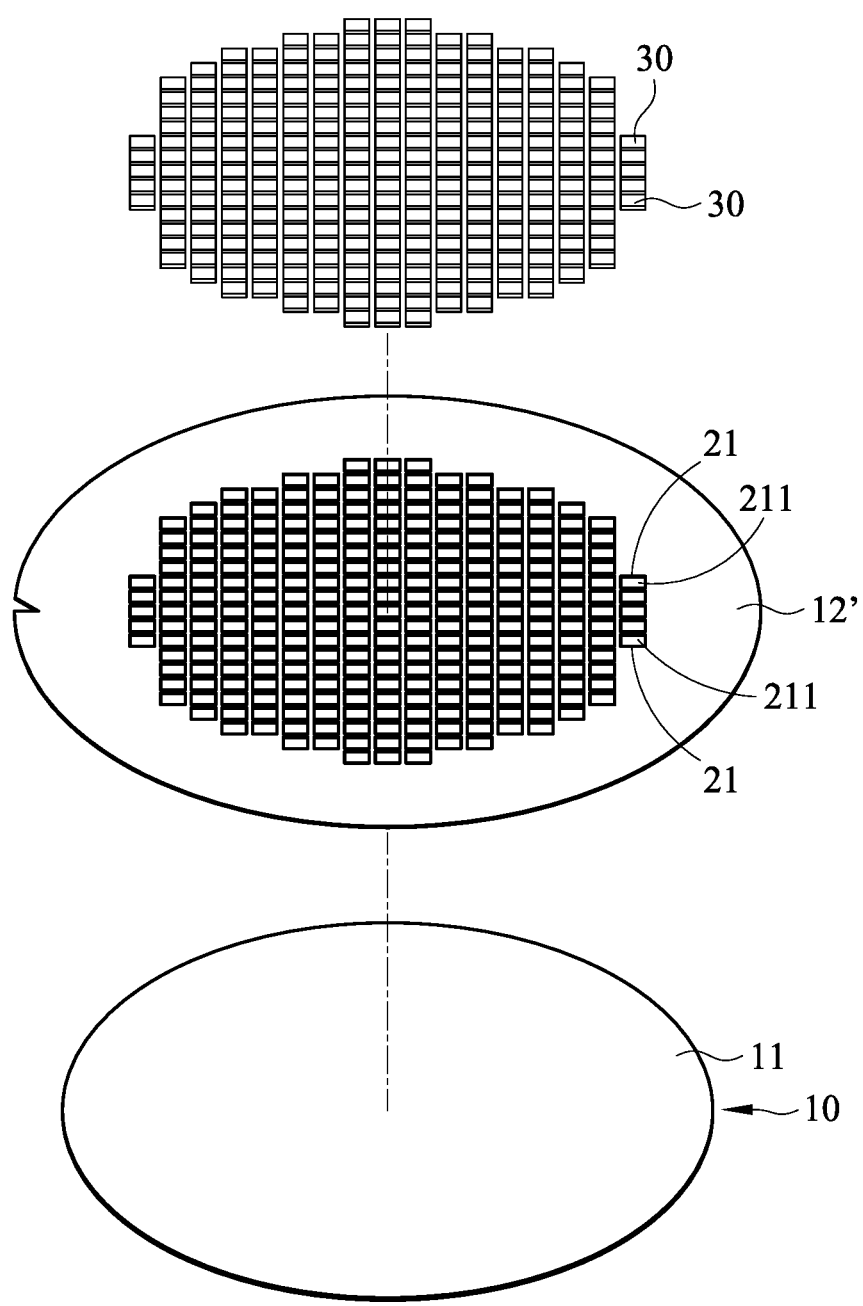
FIG. 3 is another exploded perspective view of the structure in one of the steps of a manufacturing method in accordance with the present invention.

The substrate 10 has an adhesive layer 11. The substrate 10 may be a flexible film with the adhesive layer 11 thereon, or the substrate 10 may be a single-sided tape, but is not limited thereto. As shown in FIG. 2, the substrate 10 with the adhesive layer 11 is attached to a metal ring 12.

The grid 20 is adhered to the adhesive layer 11 and comprises multiple frames 21. Each frame 21 surrounds an opening 211. In one embodiment, the grid 20 may be a flexible metal plate formed with multiple openings 211 as shown in FIG. 2 to form the frames 21. Thus, the frames 21 are integrally formed. In another embodiment, the flexible metal plate is integrally formed with the metal ring 12', but is not limited thereto. The flexible metal plate of this embodiment prevents the substrate 10 from being excessively deformed during a high-heat process. The grid 20 may be also called "foil pizza".

The semiconductor devices 30 respectively align with the openings 211 of the frames 21, i.e. that each semiconductor device 30 aligns with the opening 211 of a corresponding frame 21. The semiconductor devices 30 are adhered to the adhesive layer 11 in the openings 211. Each semiconductor device 30 comprises a body 31 and multiple solder balls 32. The body 31 has a first surface 311, a second surface, a third surface, a fourth surface, a fifth surface and a sixth surface. The solder balls 32 are formed on the first surface 311. As shown in FIG. 1A, the first surface 311 is a bottom of the semiconductor device 30. The first surface 311 of each semiconductor device 30 faces to the adhesive layer 11 so that the solder balls 32 on the first surface 311 are adhered to the adhesive layer 11 in the opening 211 of the corresponding frame 21. The first surface 311 is away from the adhesive layer 11 by a first distance d1. A size of the opening 211 of each frame 21 is smaller than a size of the body 31, and a thickness of each frame 21 is smaller than the first distance d1. Thus, a periphery of the first surface 311 is away from the corresponding frame 21 by a second distance d2, and the second distance d2 is smaller than the first distance d1. In one embodiment, the body 31 of each semiconductor device 30 comprises at least one chip 301 and an encapsulation 302 covering the chip 301.

The metal layer 33 is formed on the second to sixth surfaces of the bodies 31 of the semiconductor devices 30 and the grid 20 in the same process, i.e. that the metal layer 33 is formed on tops and four outer side surfaces of the encapsulations 302 and the grid 20.

Since the periphery of the first surface 311 of the semiconductor device 30 aligns with the corresponding frame 21, the second distance d2 is smaller than the first distance d1. Then when the metal layer 33 is formed, the volume of the metal layer 33 extending downwardly to the periphery of the first surface 311 is effectively reduced. Thus, the metal layer 33 does not connect to the solder balls 32 on the first surfaces 311.

Figure 1B:
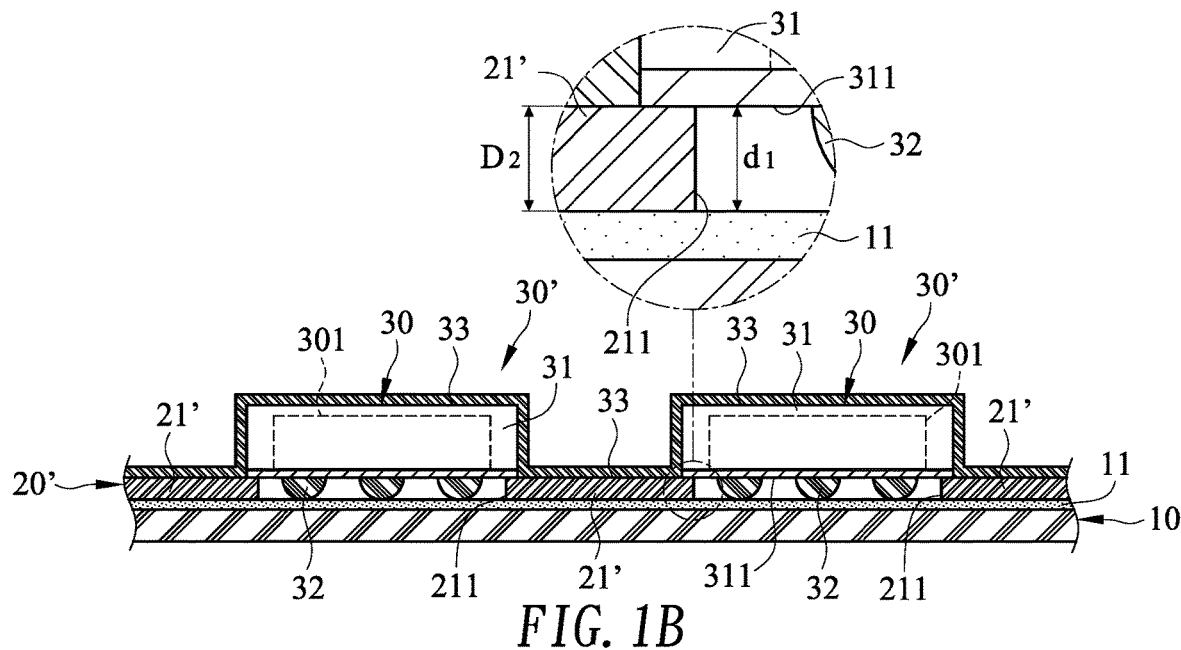
FIG. 1B is a side view in partial section of a second embodiment of a semiconductor packaging structure with a back-deposited shielding layer in accordance with the present invention.

With reference to FIG. 1B, a second embodiment of a semiconductor packaging structure with a back-deposited shielding layer in accordance with the present invention is similar to the first embodiment as described. In the second embodiment, the grid 20' is different to that of the first embodiment. A thickness D2 of the grid 20' is substantially equal to the first distance d1, i.e. that the second distance between the periphery of the first surface 311 of the semiconductor device 30 and the corresponding frame 21' is close to zero. Thus, comparing to the first embodiment, the second embodiment may more effectively reduces the volume of the metal layer 33 extending downwardly to the periphery of the first surface 311.

Figure 1C:
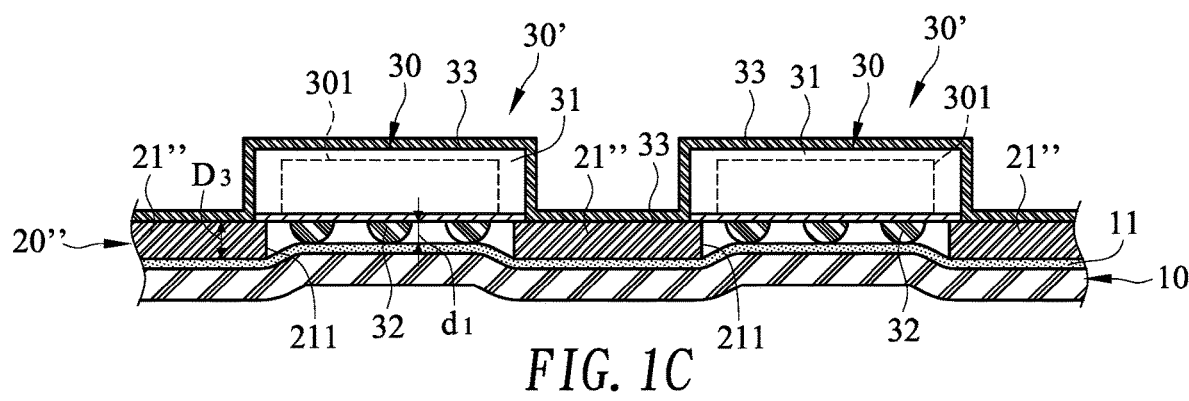
FIG. 1C is a side view in partial section of a third embodiment of a semiconductor packaging structure with a back-deposited shielding layer in accordance with the present invention.

With reference to FIG. 1C, a third embodiment of a semiconductor packaging structure with a back-deposited shielding layer in accordance with the present invention is similar to the first embodiment as described. In the third embodiment, the grid 20" is different to that of the first embodiment. A thickness D3 of the grid 20" is larger than the first distance d1, i.e. that the second distance between the periphery of the first surface 311 of the semiconductor device 30 and the corresponding frame 21" is zero. Thus, comparing to the first embodiment, the third embodiment may more effectively reduces the volume of the metal layer 33 extending downwardly to the periphery of the first surface 311.

Figure 4A:
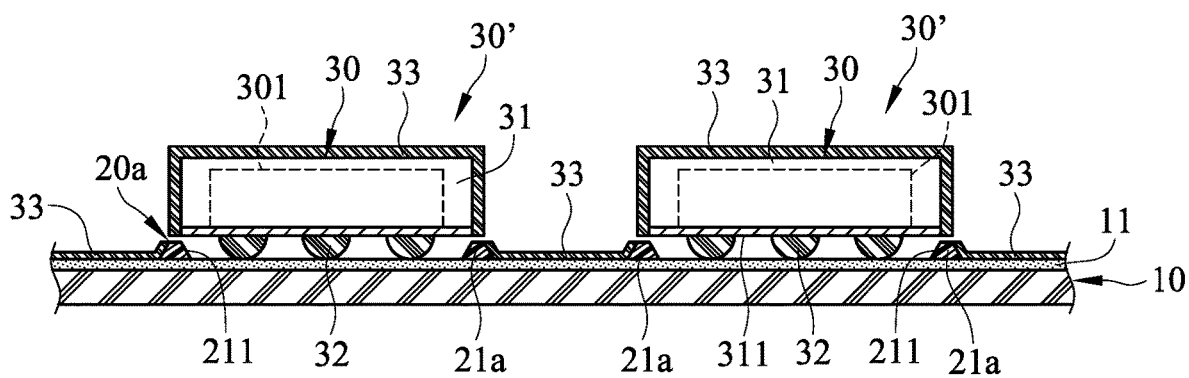
FIG. 4A is a side view in partial section of a fourth embodiment of a semiconductor packaging structure with a back-deposited shielding layer in accordance with the present invention.

With reference to FIG. 4A a fourth embodiment of a semiconductor packaging structure with a back-deposited shielding layer in accordance with the present invention is similar to the first embodiment as described. In the fourth embodiment, the grid 20a is different to that of the first embodiment. The grid 20a is heat-tolerant and is made of plastic. A width of each frame 21a shown in FIG. 4A is smaller than a width of each frame 21 shown in FIG. 1A. A thickness of each frame 21a is smaller than the first distance.

Figure 4B:
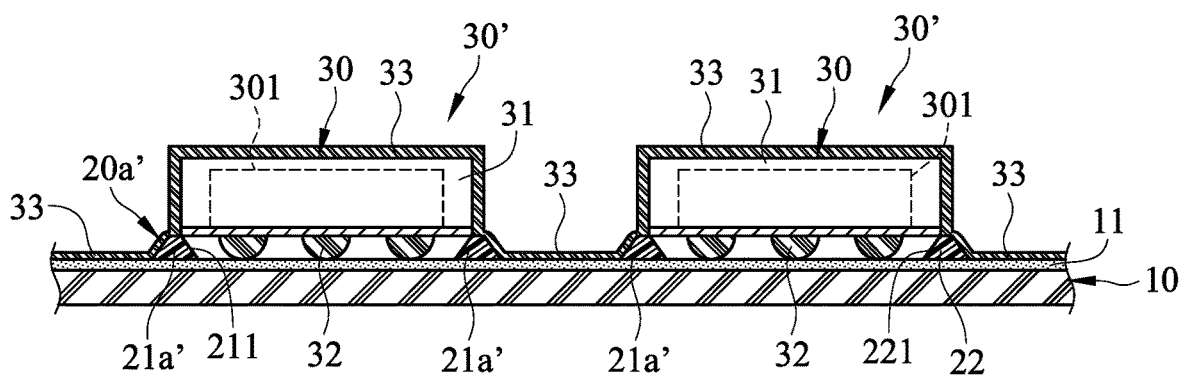
FIG. 4B is a side view in partial section of a fifth embodiment of a semiconductor packaging structure with a back-deposited shielding layer in accordance with the present invention.

With reference to FIG. 4B, a fifth embodiment of a semiconductor packaging structure with a back-deposited shielding layer in accordance with the present invention is similar to the fourth embodiment as described, but a thickness of each frame 21a' of the grid 20a' is substantially equal to the first distance.

Figure 4C:
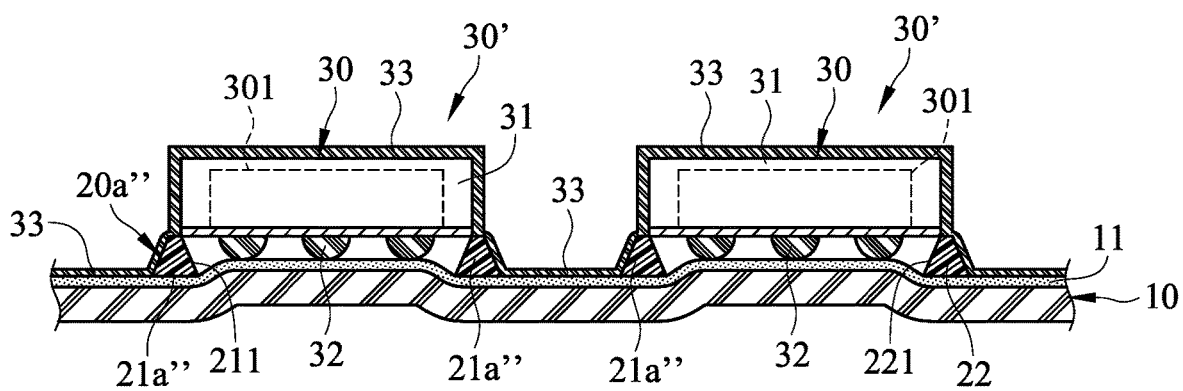
FIG. 4C is a side view in partial section of a sixth embodiment of a semiconductor packaging structure with a back-deposited shielding layer in accordance with the present invention.

With reference to FIG. 4C, a sixth embodiment of a semiconductor packaging structure with a back-deposited shielding layer in accordance with the present invention is similar to the fourth embodiment as described, but a thickness of each frame 21a" of the grid 20a" is larger than the first distance.

With reference to FIGS. 1A and 2, a manufacturing method of massively packaging the semiconductor devices into a semiconductor packaging structure with a back-deposited shielding layer in accordance with the present invention comprises following steps (a) to (e).

In the step (a), an adhesive substrate 10 is provided, i.e. that an adhesive layer 11 is formed on a substrate. In one embodiment, the adhesive substrate 10 may be a single-sided tape. The substrate may be a heat-tolerant flexible film. The single-sided tape is attached securely to a metal ring 12.

Figure 5:
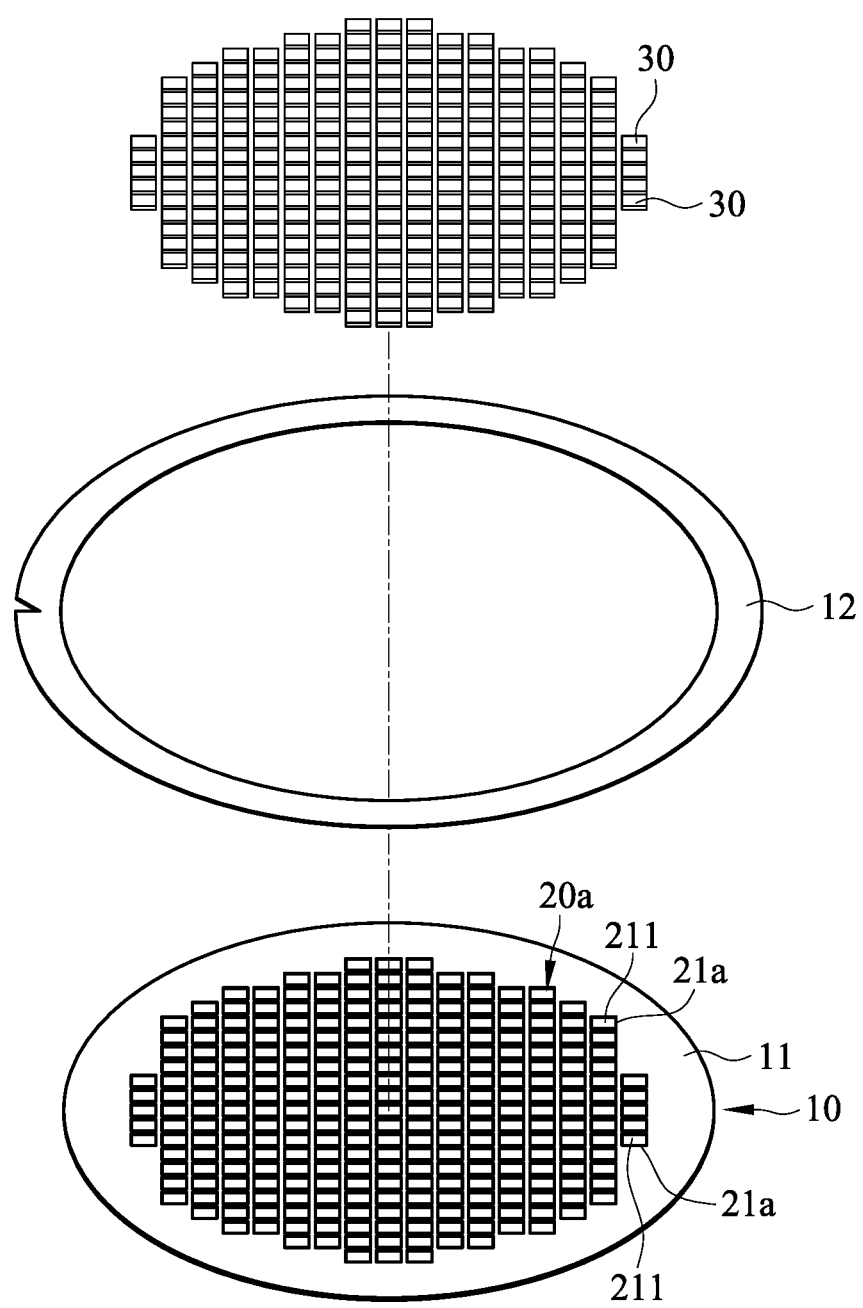
FIG. 5 is another exploded perspective view of the structure in one of the steps of a manufacturing method in accordance with the present invention.
Figure 6A:
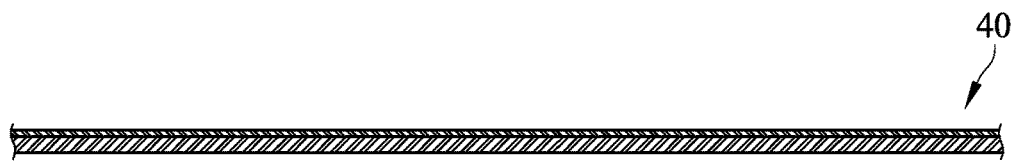
FIGS. 6A to 6E are side views in partial section of the structure in different steps of a conventional manufacturing method in accordance with the prior art.
Figure 6B:
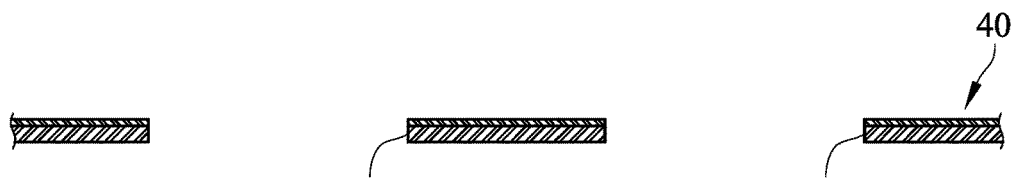
Figure 6C:
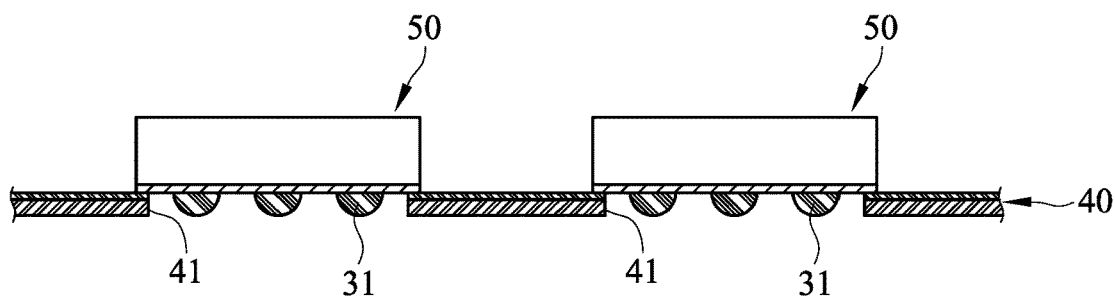
Figure 6D:
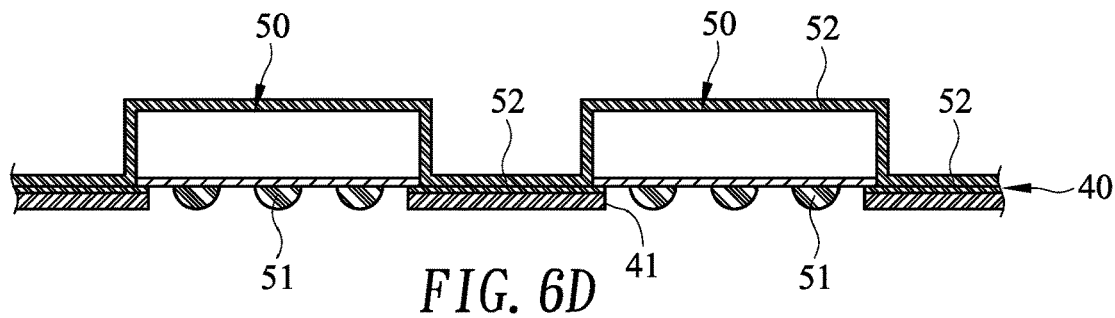
Figure 6E:
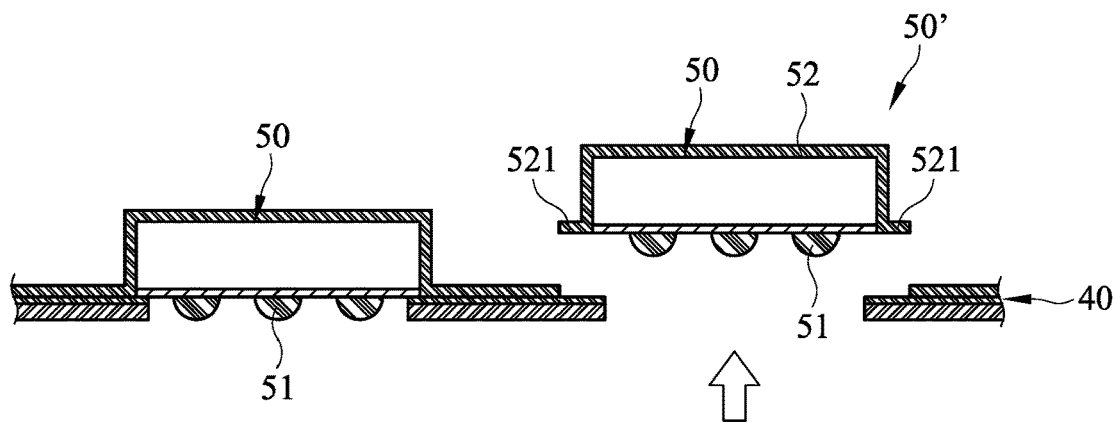
Figure 7:
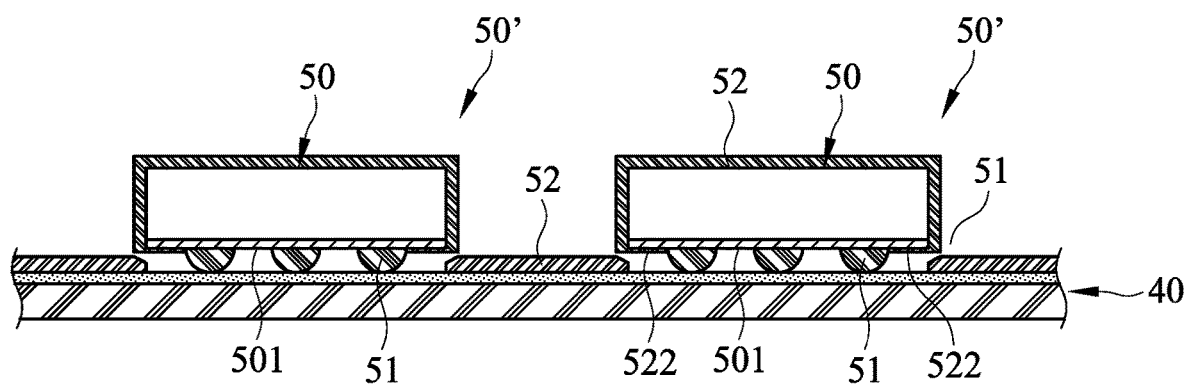
FIG. 7 is a side view in partial section of the structure in one of the steps of another conventional manufacturing method in accordance with the prior art.

In the step (b), a grid 20 is adhered to the adhesive substrate 10. The grid 20 has multiple frames 21. In one embodiment, the grid 20 may be a pre-formed metal grid. In another embodiment as shown in FIG. 5, a heat-tolerant paste is coated on the adhesive substrate 10 to form the grid 20a when the heat-tolerant paste is cured.

In the step (c), the first surfaces 311 of the semiconductor devices 30 having the solder balls 32 thereon face to the adhesive substrate 10 when the semiconductor devices 30 respectively align with the frames 21. The solder balls 32 are adhered to the adhesive substrate 10. In one embodiment as shown in FIGS. 1A and 4A, a thickness of each frame 21, 21a is smaller than a first distance between the adhesive substrate 10 and the first surface 311 of each semiconductor device 30, so that the periphery of the first surface 311 is distant from the corresponding frame 21, 21a by a second distance. The second distance is smaller than the first distance. In another embodiment as shown in FIGS. 1B and 4B, the thickness of each frame 21', 21a' is substantially equal to the first distance so that the second distance is close to zero. In another embodiment as shown in FIGS. 1C and 4C, the thickness of each frame 21", 21a" is larger than the first distance so that the second distance is zero.

In the step (d), a metal layer 33 is formed on the grid 20 and the second to sixth surfaces of the semiconductor devices. In one embodiment, the metal layer 33 may be formed by a sputtering process, a spraying process, or a coating process to form metal ions, metal powders, and liquid metal on the grid 20 and the second to sixth surfaces of the semiconductor devices.

In the step (e), each semiconductor device 30' is picked up from the adhesive substrate 10.

As shown in the foregoing description of the steps, a part of the metal layer 33 is formed on the grid 20 without adhesive surface, so that the part of the metal layer 33 on the semiconductor device 30' is easily departed from the other part of the metal layer 33 on the frames 21 of the grid 20 when the semiconductor devices 30' are picked up from the grid 20. Further, since the periphery of the first surface 311 of each semiconductor device 30' corresponds to one of the frames 21 of the grid 20, the distance between the periphery of the first surface 311 and the adhesive substrate 10 is reduced. Then when the metal layer 33 is forming, the accumulation of a large amount of metal ions, metal powder, and liquid metal on the edge of the first surface 311 is avoided. Thus, the range of the metal layer 33 extending to the periphery of the first surface 311 is effectively reduced to ensure that the metal layer 33 is not connected to the solder balls 32 on the first surface 311.

In conclusion, the adhesive substrate of the manufacturing method as described does not need to have openings in advance, so that the adhesive substrate is reusable. Further, using the grid voids the semiconductor devices with the outer metal layer to have the metal scraps during the manufacturing. Thus, the manufacturing cost of the semiconductor packaging structure with back-deposited shielding layer as described is effectively reduced.

Even though numerous characteristics and advantages of the present invention have been set forth in the foregoing description, together with the details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A semiconductor packaging structure with a back-deposited shielding layer comprising:
   a substrate having an adhesive layer;
   a grid adhered to the adhesive layer of the substrate and having multiple frames;
   multiple semiconductor devices, and each semiconductor device corresponding to one of the frames and having a body having a first surface, a second surface, a third surface, a fourth surface, a fifth surface and a sixth surface, wherein the first surface faces the adhesive layer of the substrate and is distant from the adhesive layer at a first distance;

a thickness of each frame of the grid is larger than the first distance;

a second distance is disposed between a periphery of the first surface and the corresponding frame; and the second distance is smaller than the first distance; and multiple solder balls disposed on the first surface, aligning with an opening of the corresponding frame and adhered to a portion of the adhesive layer in the opening; and a metal layer forming on the grid and the second to sixth surfaces of the bodies of the semiconductor devices.

2. The semiconductor packaging structure as claimed in claim 1, wherein the substrate is a flexible film.

3. The semiconductor packaging structure as claimed in claim 2, wherein the grid is made of metal.

4. The semiconductor packaging structure as claimed in claim 2, wherein the grid is heat-tolerant and is made of plastic.

5. The semiconductor packaging structure as claimed in claim 1, wherein the grid is made of metal.

6. The semiconductor packaging structure as claimed in claim 5, wherein the grid made of metal is integrally formed with a metal ring supporting the substrate.

7. The semiconductor packaging structure as claimed in claim 1, wherein the grid is heat-tolerant and is made of plastic.

\* \* \* \* \*